(12) United States Patent
Akaike et al.

(10) Patent No.: US 9,154,139 B2
(45) Date of Patent: *Oct. 6, 2015

(54) CRYSTAL CONTROLLED OSCILLATOR AND OSCILLATING DEVICE

(71) Applicant: NIHON DEMPA KOGYO CO., LTD., Tokyo (JP)

(72) Inventors: Kazuo Akaike, Saitama (JP); Kaoru Kobayashi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/166,814

(22) Filed: Jan. 28, 2014

(65) Prior Publication Data

US 2014/0210563 A1    Jul. 31, 2014

(30) Foreign Application Priority Data

Jan. 31, 2013  (JP) ................................ 2013-017581
Mar. 29, 2013  (JP) ................................ 2013-074573

(51) Int. Cl.
*H03L 1/04* (2006.01)
*H03L 1/02* (2006.01)

(52) U.S. Cl.
CPC . *H03L 1/04* (2013.01); *H03L 1/028* (2013.01)

(58) Field of Classification Search
USPC .......................................... 331/66, 176, 158
See application file for complete search history.

(56) References Cited

U.S. PATENT DOCUMENTS 8,729,978 B2 * 5/2014 Akaike et al. ................. 331/176

FOREIGN PATENT DOCUMENTS

| JP | 2012-170050 | 9/2012 |
| JP | 2013-038598 | 2/2013 |
| JP | 2013-051676 | 3/2013 |
| JP | 2013-051677 | 3/2013 |
| JP | 2013-098865 | 5/2013 |

* cited by examiner

*Primary Examiner* — Joseph Chang
(74) *Attorney, Agent, or Firm* — Jianq Chyun IP Office

(57) ABSTRACT

A crystal controlled oscillator of the present disclosure includes: an oscillator circuit for oscillator output, a first oscillator circuit, a second oscillator circuit, a heating unit, a pulse generator, a frequency difference detector, an addition unit, a circuit unit, a frequency measuring unit, a determination unit, and a signal selector. The signal selector is configured to: select a control signal where electric power supplied to the heating unit is smaller than supplied electric power in the detection range in a case where a frequency in a set period at the train of pulses is out of the detection range at the high temperature side; select a control signal where electric power supplied to the heating unit becomes a preset value in a case where a frequency in the set period at the train of pulses is out of the detection range at the low temperature side.

10 Claims, 16 Drawing Sheets

DDS OUTPUT, LATCH POINT

TIME

LATCH OUTPUT

TIME

LOOP FILTER OUTPUT

TIME

CRYSTAL CONTROLLED OSCILLATOR AND OSCILLATING DEVICE

CROSS-REFERENCE TO RELATED APPLICATION

This application claims the priority benefit of Japanese application serial no. 2013-017581, filed on Jan. 31, 2013, and Japanese application serial no. 2013-074573, filed on Mar. 29, 2013. The entirety of each of the above-mentioned patent applications is hereby incorporated by reference herein and made a part of this specification.

BACKGROUND

1. Technical Field

The present disclosure relates to a crystal controlled oscillator and an oscillating device using the crystal controlled oscillator. The crystal controlled oscillator detects a temperature of atmosphere where a crystal unit is placed and controls a heating unit based on a detection result of the temperature, so as to make the temperature of the atmosphere uniform.

2. Description of the Related Art

Usually, when a crystal controlled oscillator is incorporated in an application requiring sufficiently high frequency stability, an oven controlled crystal oscillator (OCXO) is ordinarily used. In temperature control by the OCXO, a thermistor is employed as a temperature sensor, and discrete parts such as an operational amplifier, a resistor, and a capacitor are employed. However, due to individual variation and long-term changes in analog parts, it was not possible to carry out temperature control within ±20 m° C., for example.

However, in base stations and relay stations, for example, use of inexpensive clock signals with significantly high stability is being demanded, the handling of which would consequently be a predictably difficult situation with the conventional OCXO.

Japanese Unexamined Patent Application Publication No. 2012-170050 discloses a Temperature Compensated Crystal Oscillator (TCXO) that recognizes a value according to a difference between oscillation frequencies of two crystal units as a temperature detection value and corrects a set frequency of the oscillating device according to the temperature detection value. However, the method relates to a temperature compensated crystal oscillator (TCXO) that corrects an oscillation frequency based on temperature detection but does not relate to the OCXO.

SUMMARY

The present disclosure has been made in view of the aforementioned problems, and provides a technique that allows obtaining oscillation output with high frequency stability, and allows restricting reduction in a yield of the crystal unit with the crystal controlled oscillator (OCXO) that detects a temperature of atmosphere where a crystal unit is placed and controls a heating unit based on a detection result of the temperature, so as to make the temperature of the atmosphere uniform.

A crystal controlled oscillator of the present disclosure includes: an oscillator circuit for oscillator output, a first oscillator circuit, a second oscillator circuit, a heating unit, a pulse generator, a frequency difference detector, an addition unit, a circuit unit, a frequency measuring unit, a determination unit, and a signal selector. The oscillator circuit for oscillator output is connected to a crystal unit for oscillator output. The first oscillator circuit and the second oscillator circuit are connected to respective first crystal unit and second crystal unit for temperature detection. The heating unit is configured to uniform an atmosphere temperature where each of the crystal units is placed. The pulse generator and a frequency difference detector that assume that an oscillation frequency of the first oscillator circuit is f1, an oscillation frequency of the first oscillator circuit at a reference temperature is f1r, an oscillation frequency of the second oscillator circuit is f2, and an oscillation frequency of the second oscillator circuit at the reference temperature is f2r. The pulse generator is configured to output a pulse at a time point where one of the f1 and the f2 latches another f1 or f2. The frequency difference detector is configured to obtain a direct current (DC) voltage corresponding to a difference value between a value corresponding to a difference between f1 and f1r and a value corresponding to a difference between f2 and f2r with phase locked loop (PLL) based on a train of the pulses, as a temperature detection value. The addition unit is configured to take out a deviation between a temperature setting value of atmosphere temperature where a crystal unit is placed and the temperature detection value. The circuit unit is configured to control heating electric power that controls electric power supplied to the heating unit based on the deviation taken out at the addition unit. The frequency measuring unit is configured to measure a frequency in a set period at the train of pulses. The determination unit is configured to determine whether the frequency measured by the frequency measuring unit is included in a detection range, out of the detection range at a high temperature side, or out of the detection range at a low temperature side. The signal selector is configured to: select a control signal where electric power supplied to the heating unit is smaller than supplied electric power in the detection range in a case where a frequency in a set period at the train of pulses is out of the detection range at the high temperature side; to select a control signal where electric power supplied to the heating unit becomes a preset value in a case where a frequency in the set period at the train of pulses is out of the detection range at the low temperature side.

The present disclosure is a crystal controlled oscillator (OCXO) that detects a temperature of atmosphere where a crystal unit is placed and controls a heating unit based on a detection result of the temperature to make the temperature of the atmosphere uniform. The present disclosure targets for an apparatus that treats a value corresponding to a difference between oscillation frequencies of two crystal units as a temperature detection value. A pulse train obtained by latching an oscillation frequency of one crystal unit by the oscillation frequency of the other crystal unit is retrieved by PLL, thus a temperature detection value is generated. In such circuit, whether a frequency in a set period at the train of pulses can be received in the PLL or not is determined. If the frequency in the set period at the train of pulses is out of a detection range at a high temperature side, electric power supplied to a heating unit is set to, for example, zero. In a case where the frequency in a set period at the train of pulses is out of the detection range at the low temperature side, the electric power is set to, for example, a maximum value.

Therefore, a problem that the heater cannot be normally controlled with an indefinite temperature detection value can be solved, obtaining an oscillation output with high frequency stability. This leads to reduction in requests of frequency-temperature characteristics for each first crystal unit and second crystal unit. Consequently, reduction in a yield of the crystal unit can be reduced.

DETAILED DESCRIPTION

Outline of Embodiment

Figure 1:
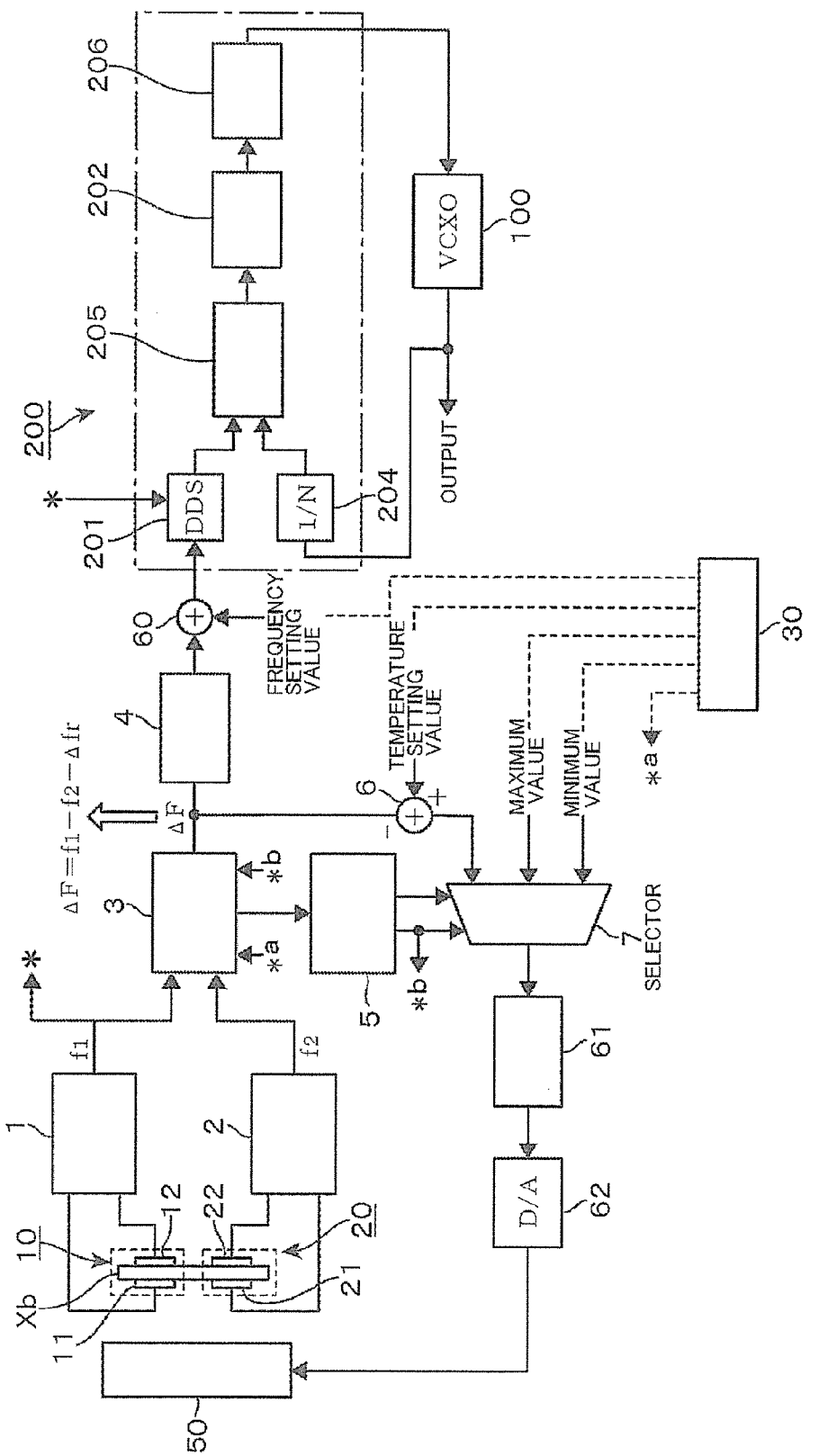
FIG. 1 is a block diagram illustrating an overall configuration of an embodiment of the present disclosure.

Before describing details of embodiments of the present disclosure, an outline of this embodiment will be briefly described. Reference numeral 200 in FIG. 1 denotes a control circuit unit in this description. However, the control circuit unit is actually a circuit with oscillating function typically using PLL. Reference numeral 201 denotes a Direct Digital Synthesizer (DDS) that outputs a reference signal used for PLL.

Reference numeral 1 in FIG. 1 denotes a first oscillator circuit. An oscillation output from the first oscillator circuit is used as a clock signal to operate the DDS. Accordingly, to stabilize an output from a voltage controlled oscillator 100 (this output corresponds to the oscillation output of a product in this example), stabilizing the clock signal is required consequently.

Therefore, to stabilize an oscillation output of the first oscillator circuit 1, an atmosphere temperature of a crystal unit 10 is uniformed using a heater circuit 50. A relationship between a value corresponding to a difference between oscillation frequencies of two crystal units 10 and 20 and a temperature is grasped in advance. As a temperature detection signal for controlling an amount of heat generation of the heater circuit 50, this value corresponding to the difference is employed.

The value corresponding to the difference between the oscillation frequencies will be described later. To avoid complexity of a term, a part that obtains the value is referred to as a frequency difference detector 3. In this embodiment, an output ΔF from the frequency difference detector 3 corresponding to the temperature detection signal is employed not only for control of the heater circuit 50, but also used for correction of a frequency setting value corresponding to a setting value of an output frequency from the voltage controlled oscillator 100. The frequency setting value is output by reading data in a memory 30 by a computer. Therefore, the oscillating device of the embodiment has OCXO function and TCXO function. The present disclosure is applicable to an oscillating device without TCXO function.

This embodiment includes a circuit part that determines whether a difference between the oscillation frequency of the first oscillator circuit 1 and the oscillation frequency of the second oscillator circuit 2 is within the detection range in the frequency difference detector 3 or not, and takes an appropriate action when the frequency difference detector 3 generates the above-described ΔF corresponding to the temperature detection signal. This circuit part corresponds to an out-of-detection range determination unit 5 and a selector 7 in FIG. 1.

Overall Explanation of Embodiment

Next, the overall embodiment of the present disclosure will be described in detail. FIG. 1 is a block diagram illustrating an entire oscillating device constituted by applying a crystal controlled oscillator according to an embodiment of the present disclosure. This oscillating device is structured as a frequency synthesizer that outputs a frequency signal of a set frequency, and includes the voltage controlled oscillator 100 using a crystal unit, the control circuit unit 200 that constitutes a PLL in the voltage controlled oscillator 100, a crystal controlled oscillator (a reference numeral is not given) that generates a clock signal to operate a DDS circuit unit 201 for generating a reference signal of the PLL, and a heater circuit 50, which is a heating unit, that adjusts temperature of atmosphere around the crystal units 10 and 20 in this crystal controlled oscillator.

The oscillating device also includes a temperature compensation unit that performs temperature compensation of reference clock input into the control circuit unit 200. Although a reference numeral is not given to the temperature compensation unit, the unit corresponds to a part on the left side of the control circuit unit 200 in FIG. 1. The temperature compensation unit is shared with a circuit part for controlling the heater circuit 50.

The control circuit unit 200 compares, at a phase comparison unit 205, a phase of reference clock (for reference) output from a DDS circuit unit 201 with a phase of clock as a result of frequency-dividing an output of the voltage controlled oscillator 100 at a frequency divider 204. A phase difference as a result of the comparison is analog-converted by a charge pump 202. The analog-converted signal is input into a loop filter 206 and controlled so that a Phase locked loop (PLL) is stabilized. Therefore, it is also possible to say that the control circuit unit 200 is a PLL unit. Here, the DDS circuit unit 201 uses a frequency signal output from a later-described first oscillator circuit 1 as the reference clock, and frequency data (digital value) for outputting a signal of intended frequency is input therein.

However, a frequency of the reference clock has a temperature characteristic, so that in order to cancel the temperature characteristic, a signal corresponding to a later-described frequency correction value is added, at an addition unit 60, to the frequency data to be input into the DDS circuit unit 201. Correcting the frequency data to be input into the DDS circuit unit 201 cancels an amount of temperature variation of the output frequency of the DDS circuit unit 201 based on an amount of variation in the temperature characteristic of the reference clock. Consequently, a frequency of reference clock is stabilized with respect to the temperature variation, and accordingly, an output frequency from the voltage controlled oscillator 100 is stabilized.

This embodiment configures the crystal controlled oscillator, which creates a reference clock as described later, as OCXO, and this stabilizes a frequency of the reference clock, and therefore, temperature characteristics of the reference clock is not observed. However, this embodiment has an advantage as follows. In case of malfunction of the heater, for example, the frequency synthesizer with significantly high reliability can be configured by compensating for the amount of temperature variation of the output frequency from the DDS circuit unit 201 based on the amount of temperature characteristic variation of the reference clock.

Next, the OCXO part corresponding to the crystal controlled oscillator of the present disclosure will be described. This crystal controlled oscillator includes the first crystal unit 10 and the second crystal unit 20. The first crystal unit 10 and the second crystal unit 20 are constituted using a crystal element Xb in common. That is, for example, a strip-shaped area of the crystal element Xb is divided into two in a longitudinal direction, and respective electrodes for excitation are disposed on both front and back surfaces of each divided area (vibration area). Accordingly, the first crystal unit 10 is constituted of one divided area and a pair of electrodes 11 and 12. The second crystal unit 20 is constituted of the other divided area and a pair of electrodes 21 and 22. Accordingly, the first crystal unit 10 and the second crystal unit 20 may be assumed to be thermally coupled. An AT-cut crystal element Xb is used in this example.

To the first crystal unit 10 and the second crystal unit 20, respective first oscillator circuit 1 and second oscillator circuit 2 are connected. Each of outputs of these oscillator circuits 1 and 2 may be an overtone (higher harmonics) of each of the crystal units 10 and 20, or may also be a fundamental wave of each of the crystal units 10 and 20, for example. When the output of overtone is obtained, a tuning circuit for overtone may be provided in an oscillation loop formed of a crystal unit and an amplifier, for example, and the oscillation loop may be oscillated by the overtone. Alternatively, the oscillation loop may be oscillated by the fundamental wave, a class C amplifier may be provided at a subsequent stage of an oscillation stage, for example, at a subsequent stage of an amplifier being a part of Colpitts circuit, to distort the fundamental wave using the class C amplifier, and a tuning circuit tuned to the overtone may be provided at a subsequent stage of the class C amplifier, thereby, resultantly, a third overtone oscillation frequency, for instance, may be output from each of the oscillator circuits 1 and 2.

Here, for convenience, it is assumed that a frequency signal of the frequency f1 is output from the first oscillator circuit 1 while a frequency signal of the frequency f2 is output from the second oscillator circuit 2. The frequency signal of the frequency f1 is supplied to the control circuit unit 200 as the reference clock. Reference numeral 3 denotes a frequency difference detector. The frequency difference detector 3 is, to say schematically, a circuit unit to retrieve f2−f1−Δfr, which is a difference between Δfr and a difference between f1 and f2. Δfr is a difference between f1 (f1r) and f2 (f2r) at the reference temperature, for example, 25° C. One exemplary difference between f1 and f2 is, for example, several MHz. The present disclosure is met by calculating ΔF, which is a difference between a value corresponding to a difference between f1 and f2 and a value corresponding to a difference between f1 and f2 at the reference temperature, for example, 25° C. by the frequency difference detector 3. To be more specific, a value that can be obtained in the frequency difference detector 3 is $\{(f2-f1)/f1\}-\{(f2r-f1\ r)/f1r\}$ in this embodiment. However, in the drawings, indication of the output from the frequency difference detector 3 is omitted.

Figure 2:
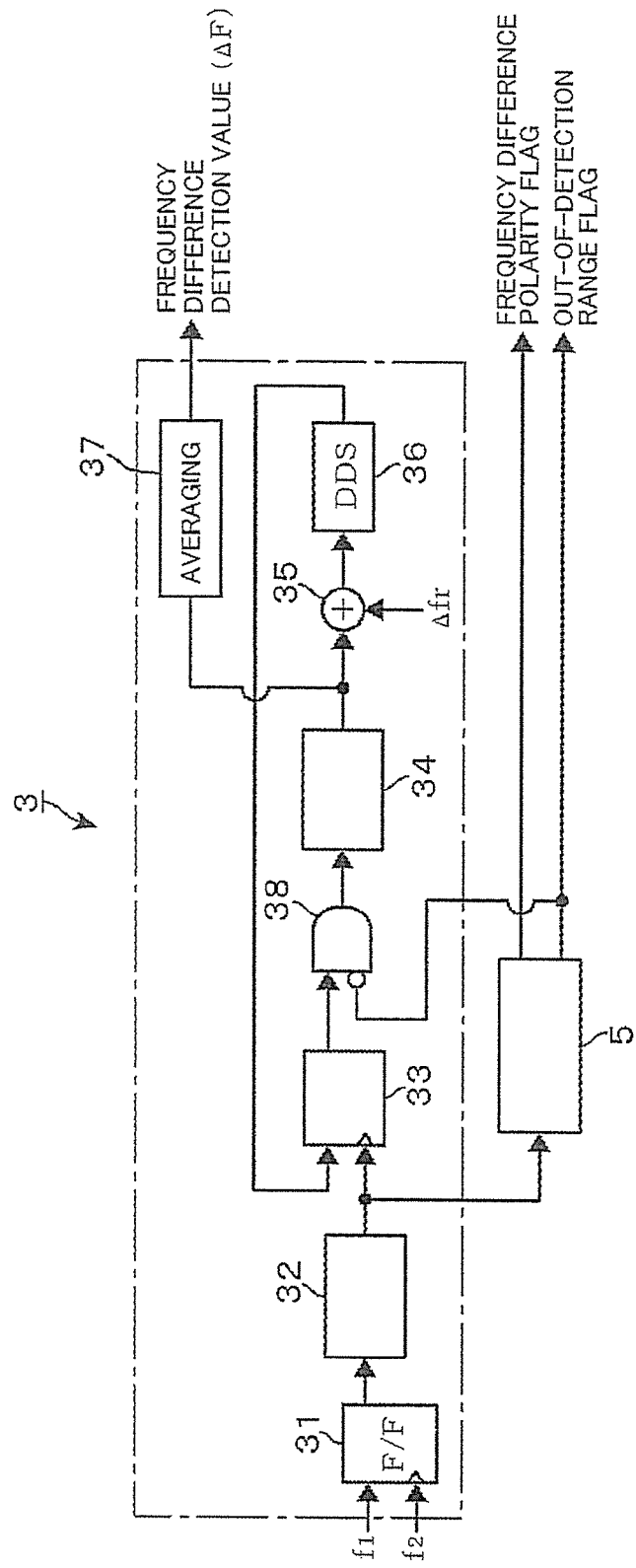
FIG. 2 is a block diagram illustrating a part of the embodiment of the present disclosure.

FIG. 2 illustrates a concrete example of the frequency difference detector 3. Reference numeral 31 denotes a flip-flop circuit (a F/F circuit). The frequency signal of the frequency f1 is input from the first oscillator circuit 1 to one input port of the flip-flop circuit 31. The frequency signal of the frequency f2 is input from the second oscillator circuit 2 to the other input port of the flip-flop circuit 31. The frequency signal of the frequency f2 from the second oscillator circuit 2 is latched with the frequency signal of the frequency f1 from the first oscillator circuit 1. To avoid redundancy of description, hereinafter f1 and f2 are treated as representing a frequency or the frequency signal itself. The flip-flop circuit 31 outputs a signal of a frequency (f2−f1), which is a value corresponding to a frequency difference between f1 and f2.

Figure 3:
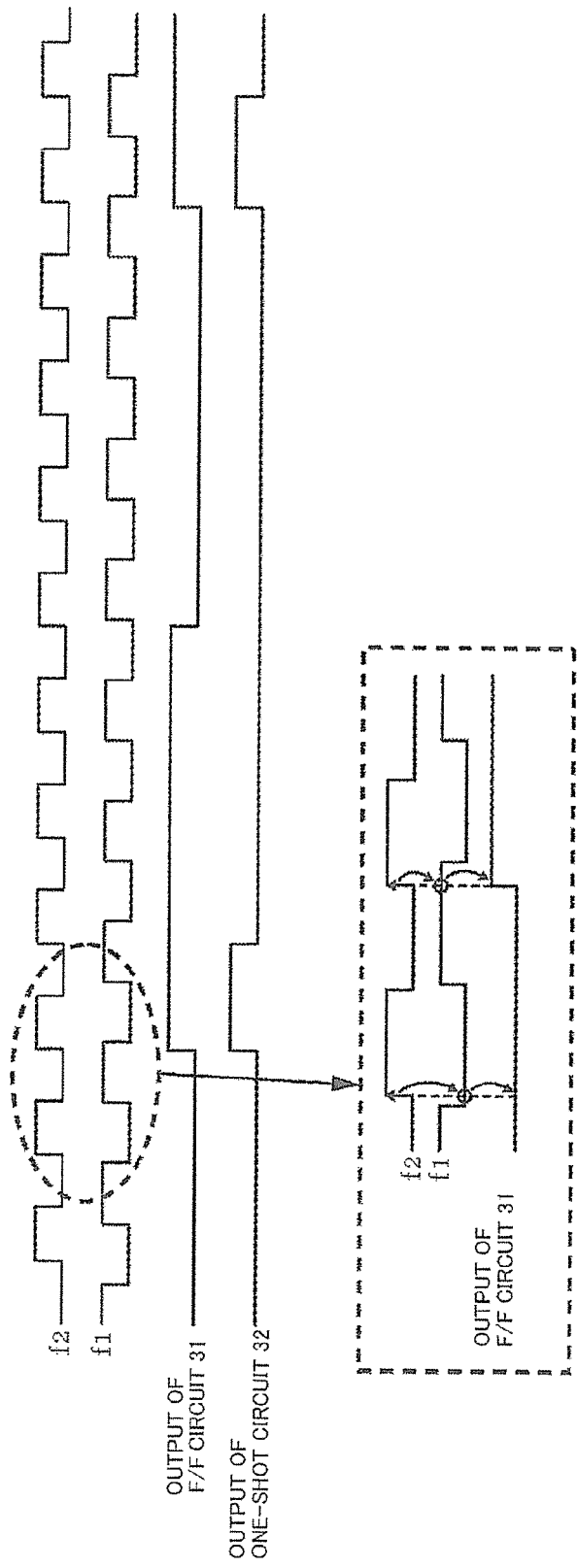
FIG. 3 is a waveform view of a part of an output shown in FIG. 2.

A one-shot circuit 32 is disposed in a position after the flip-flop circuit 31. The one-shot circuit 32 outputs a one-shot pulse on the rising edge of the pulse signal obtained from the flip-flop circuit 31. FIG. 3 is a timing chart illustrating a sequence of signals up to now.

PLL (Phase Locked Loop) is disposed in a position after the one-shot circuit 32. This PLL includes a latch circuit 33, a first loop filter 34 with an integration function, a first addition unit 35, and a DDS circuit unit 36. Between the latch circuit 33 and the loop filter 34, a logic circuit 38 is disposed. The logic circuit 38 prevents an output from the latch circuit 33 from being input to the loop filter 34 under a certain condition.

The latch circuit 33 latches a sawtooth wave output from the DDS circuit unit 36 with a pulse output from the one-shot circuit 32. An output from the latch circuit 33 is a signal level of the sawtooth wave at a time point of the pulse output. The loop filter 34 integrates a DC voltage of this signal level. The first addition unit 35 adds this DC voltage to a DC voltage corresponding to Δfr (the difference between f1 and f2 at the reference temperature, for example, 25° C.). DC voltage data corresponding to Δfr is stored in the memory 30 shown in FIG. 1.

In this example, regarding a sign in the first addition unit 35, "+" is given to an input side of the DC voltage corresponding to Δfr, and "−" is given to an input side of the output voltage of the loop filter 34. The DDS circuit unit 36 receives a voltage, which is a DC voltage operated by the first addition unit 35, that is, a voltage where an output voltage of the loop filter 34 is subtracted from the DC voltage corresponding to Δfr. The sawtooth wave of a frequency corresponding to this voltage value is output. For easy understanding of the operation of the PLL, FIG. 4A to FIG. 4C very schematically illustrate a state of an output from each unit, and a very schematic description will be provided for intuitive grasp. At a time point of powering on the apparatus, a DC voltage corresponding to $\Delta fr$ is input to the DDS circuit unit 36 through the first addition unit 35. For example, assume that $\Delta fr$ is 5 MHz, a sawtooth wave of a frequency corresponding to this frequency is output from the DDS circuit unit 36.

Figure 4A:
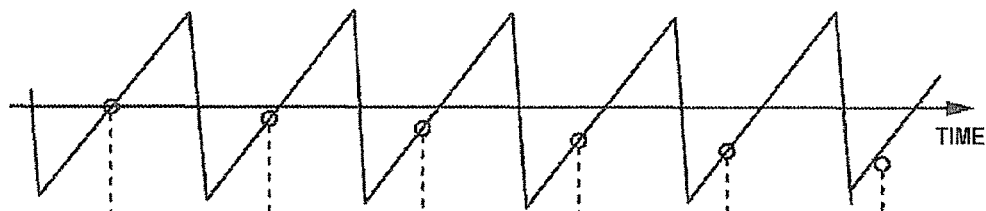
FIG. 4A to FIG. 4C are waveform views of respective units schematically illustrating a state of unlocked loop including a DDS circuit unit shown in FIG. 2.
Figure 4B:
Figure 4C:
Figure 5A:
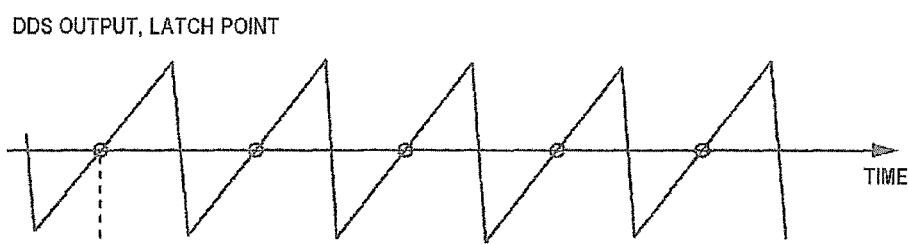
FIG. 5A to FIG. 5C are waveform views of respective units schematically illustrating a state of locked loop including the DDS circuit unit shown in FIG. 2.
Figure 5B:
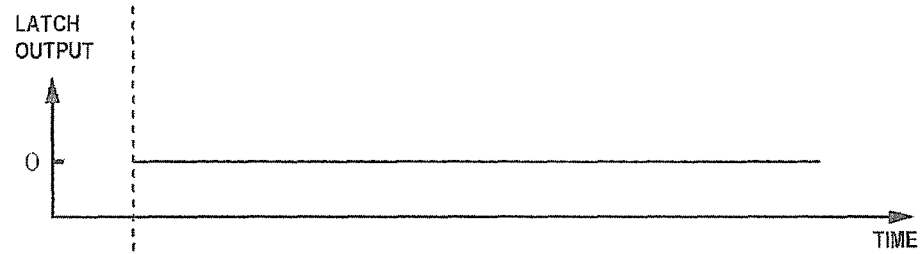
Figure 5C:
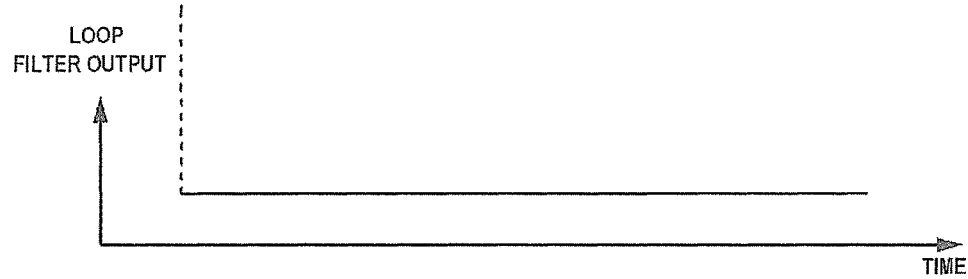

The sawtooth wave is latched at a pulse of a frequency corresponding to (f2−f1) with the latch circuit 33. Assuming that (f2−f1) is, for example, 6 MHz, since a period of a pulse for the latch is shorter than a period of the sawtooth wave, the latch point of the sawtooth wave gradually decreases as shown in FIG. 4A. An output from the latch circuit 33 and an output from the loop filter 34 are, as shown in FIG. 4B and FIG. 4C, gradually decreasing to the minus side. Since the sign of the output side of the loop filter 34 in the first addition unit 35 is "−", a DC voltage input from the first addition unit 35 to the DDS circuit unit 36 increases. Accordingly, the frequency of the sawtooth wave output from the DDS circuit unit 36 becomes high. When a DC voltage corresponding to 6 MHz is input to the DDS circuit unit 36, the frequency of the sawtooth wave becomes 6 MHz, and the PLL is locked as shown in FIG. 5A to FIG. 5C. Here, a DC voltage output from the loop filter 34 is a value corresponding to $\Delta fr-(f2-f1)=-1$ MHz. That is, an integral value of the loop filter 34 can be a value corresponding to an integral value of an amount of variation of 1 MHz when the sawtooth wave changes from 5 MHz to 6 MHz.

Figure 6A:
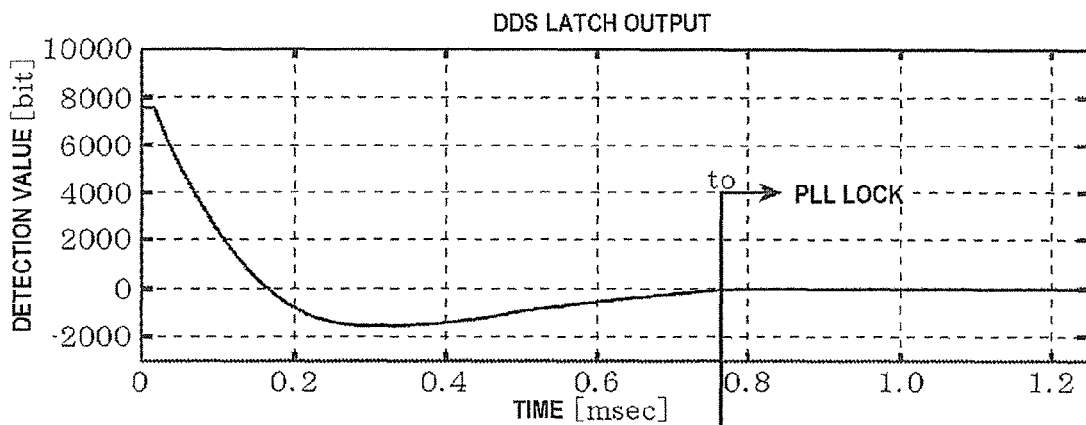
FIG. 6A and FIG. 6B are waveform views of respective units in the loop of an actual device corresponding to the embodiment.
Figure 6B:
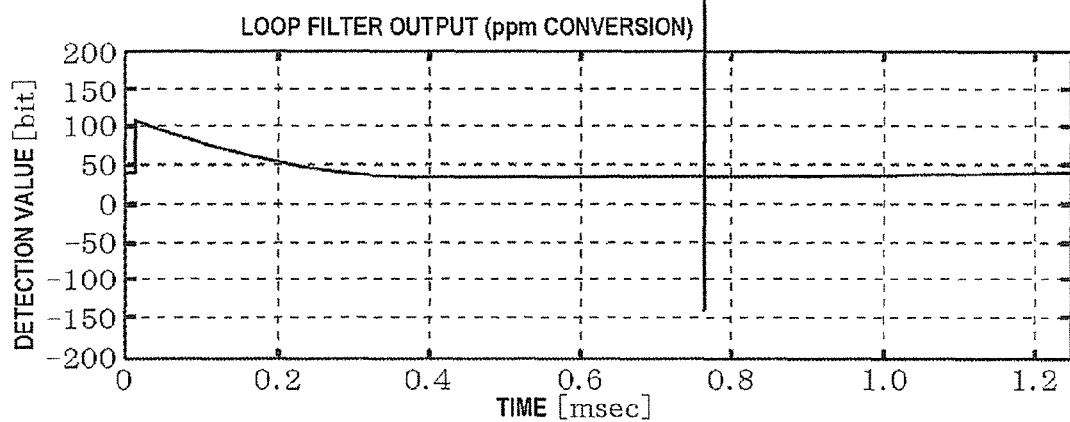

Contrary to this example, in the case where $\Delta fr$ is 6 MHz and (f2−f1) is 5 MHz, since the period of the pulse for the latch is longer than that of the sawtooth wave, the latch point shown in FIG. 4A gradually increases. Accordingly, an output of the latch circuit 33 and an output of the loop filter 34 also increase. Therefore, a value subtracted by the first addition unit 35 becomes large. This causes gradual decrease in the frequency of the sawtooth wave, eventually, when the frequency becomes 5 MHz, which is equal to (f2−f1), the PLL is locked. Then, a DC voltage output from the loop filter 34 is a value corresponding to $\Delta fr-(f2-f1)=$MHz. FIG. 6A and FIG. 6B show actual measurement data, and in this example, the PLL is locked at time to.

Meanwhile, as described above, the actual output from the frequency difference detector 3 is, that is, an output from an averaging circuit 37 shown in FIG. 2, which is a value where a $\{(f2-f1)/f1\}-\{(f2r-f1r)/f1r\}$ value is expressed in a 34-bit digital value. Assume that the collection of these values from near −50° C. to near 100° C. is (f1−f1r)/f1r=OSC1 (the unit is ppm or ppb) and (f2−f2r)/f2r=OSC2 (the unit is ppm or ppb), a variation relative to temperature forms practically the same curve as OSC2−OSC1. Accordingly, an output from the frequency difference detector 3 can be treated as OSC2−OSC1=temperature data.

A latch operation of f1 by f2 in the flip-flop circuit 31 is asynchronous. Hence, an indefinite period such as a metastable (when input data is latched at a time point of an edge of a clock, the input data needs to be held for a certain period of time before and after the edge at the time point of the latch. The metastable is a state where an output is destabilized by changing the clock and the input data approximately simultaneously.) may occur. There is a possibility that an instantaneous error is included in an output from the loop filter 34. Therefore, the averaging circuit 37, which is a circuit obtaining a moving average of an input value at a preliminarily set time, is disposed at an output side of the loop filter 34 to remove the instantaneous error even if the error occurs. By providing the averaging circuit 37, it is possible to obtain, conclusively, frequency deviation information by the amount of variation in temperature with high accuracy. However, the averaging circuit 37 may not be disposed.

Figure 7:
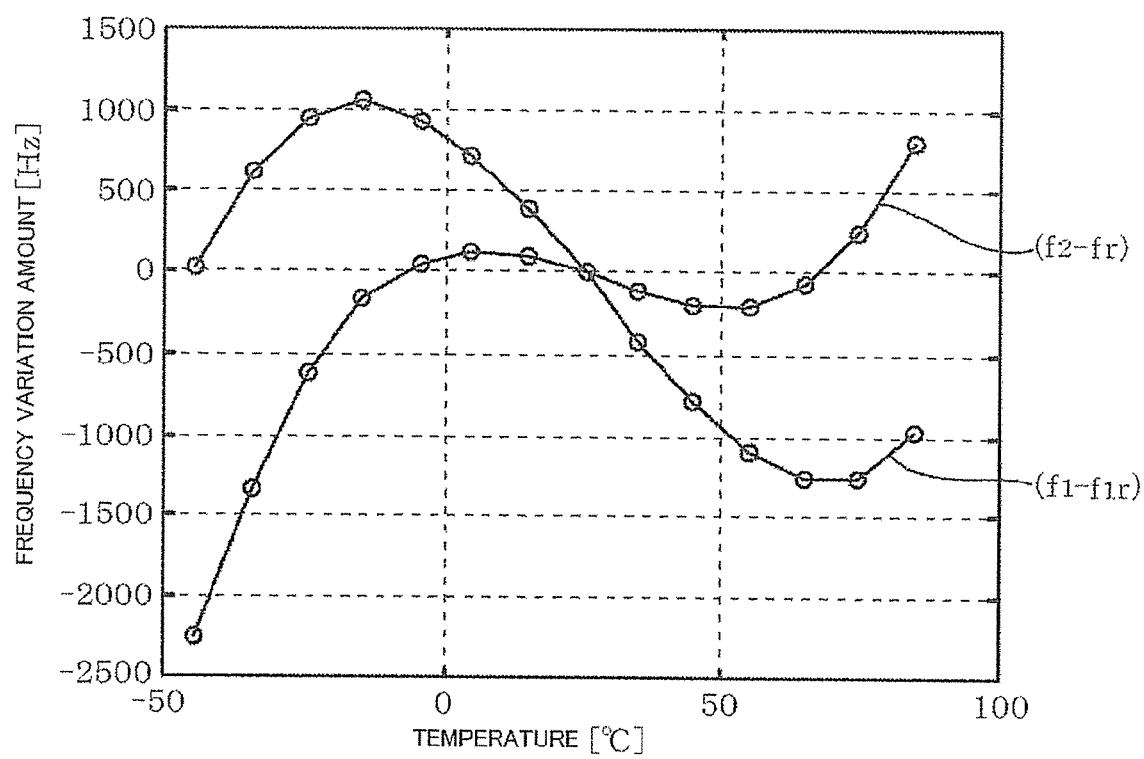
FIG. 7 is a frequency versus temperature characteristic graph illustrating a relationship between: a frequency f1 of a first oscillator circuit and a frequency f2 of a second oscillator circuit; and a temperature.

Here, a description will be given of OSC2−OSC1, which is frequency deviation information of an amount of variation in temperature obtained at the loop filter 34 of the PLL, with reference to FIG. 7 to FIG. 10. FIG. 7 is a characteristic diagram illustrating a relationship between temperature and a frequency where f1 and f2 are normalized at the reference temperature. Here, "normalized" means the following. A reference temperature is set, for example, at 25° C. In the relationship between temperature and a frequency, a frequency at the reference temperature is regarded as zero. Finally, the relationship between an amount of deviation of a frequency from the frequency at the reference temperature and temperature is obtained. Assume that a frequency of the first oscillator circuit 1 at 25° C. is f1 r, and a frequency of the second oscillator circuit 2 at 25° C. is f2r, that is, if the values of f1 and f2 at 25° C. are set to respective f1r and f2r, values on a vertical axis in FIG. 7 represent (f1−f1r) and (f2−f2r).

Figure 8:
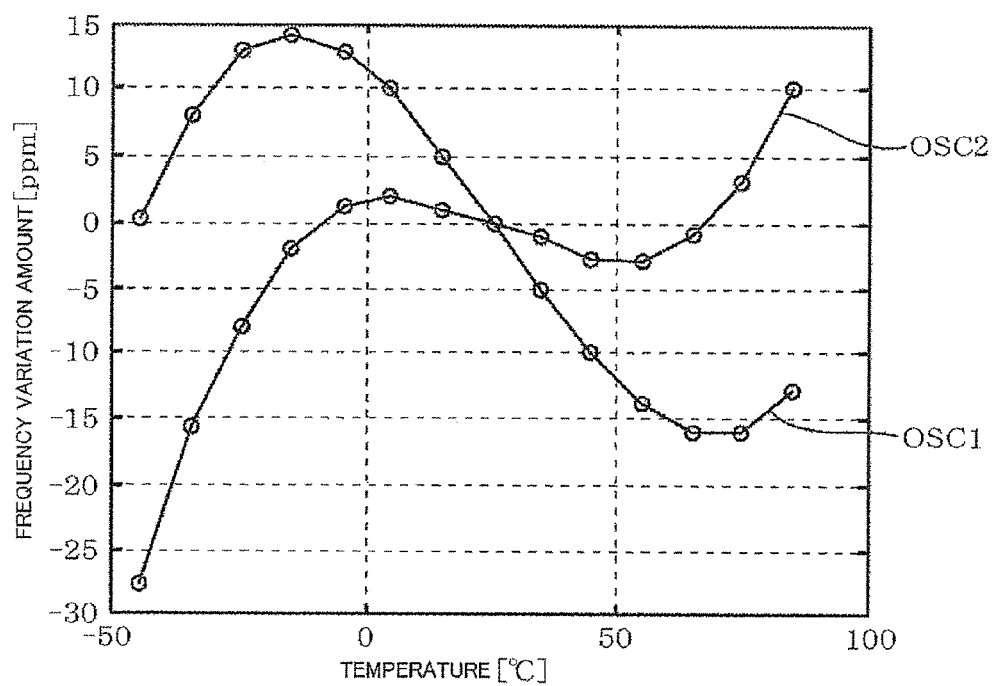
FIG. 8 is a frequency versus temperature characteristic graph illustrating a relationship between: normalized values of respective rates of change of f1 and change of f2 with a value at a reference temperature; and a temperature.

FIG. 8 illustrates a rate of change of a frequency at each temperature shown in FIG. 7 relative to a frequency at the reference temperature (25° C.). Accordingly, the vertical axis values in FIG. 8 are (f1−f1r)/f1r and (f2−f2r)/f2r, that is, as described above, OSC1 and OSC2. The unit for the vertical axis values in FIG. 8 is ppm.

Figure 9:
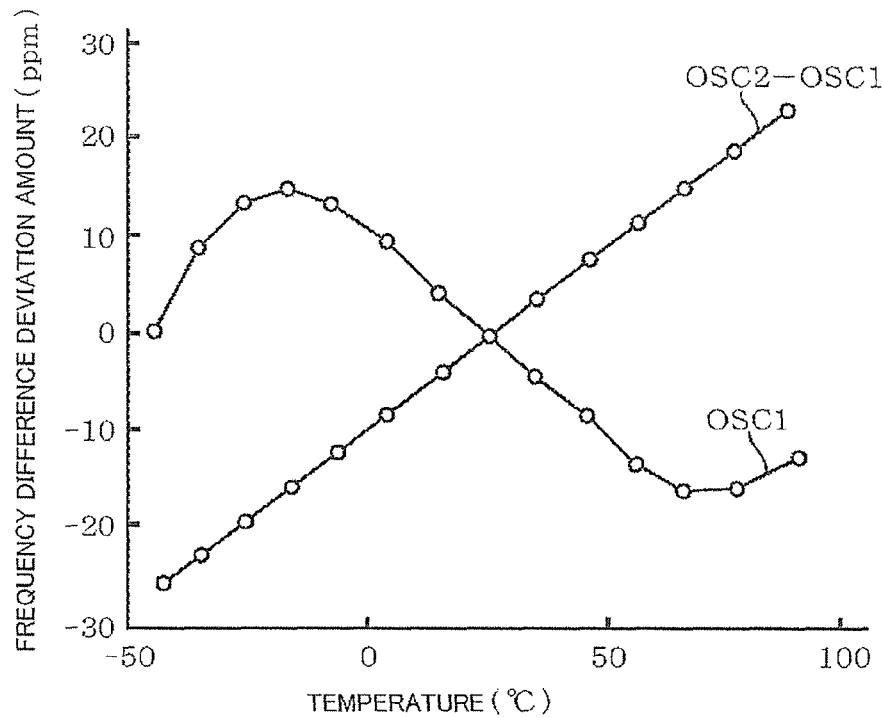
FIG. 9 is a frequency versus temperature characteristic graph illustrating a relationship between: a difference between OSC1 and OSC2 shown in FIG. 8; and a temperature.

FIG. 9 illustrates the relationship between OSC1 and temperature (which is the same as FIG. 8) and the relationship between (OSC2−OSC1) and temperature. It can be seen that (OSC2−OSC1) forms a straight line relative to temperature. Accordingly, it can be seen that (OSC2−OSC1) corresponds to an amount of deviation of temperature variation from the reference temperature. Further, generally, it is said that a frequency versus temperature characteristics of a crystal unit is represented by a cubic function, if a relationship between a frequency correction value that offsets an amount of frequency variation obtained by the cubic function and (OSC2−OSC1) is obtained, the frequency correction value is obtained based on a detection value of (OSC2−OSC1).

Figure 10:
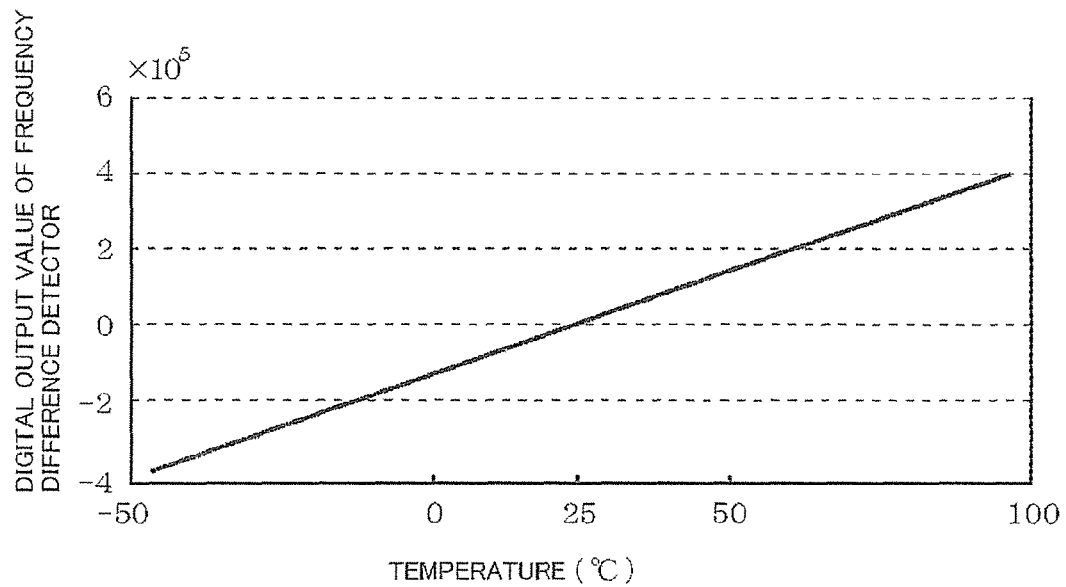
FIG. 10 is a characteristic view illustrating a relationship between a digital output value of a frequency difference detector and a temperature.

FIG. 10 illustrates a relationship between a 34-bit digital value, which is an output signal from the frequency difference detector 3, and a temperature. Accordingly, it can be seen that (OSC2−OSC1) corresponds to an amount of deviation of temperature variation from the reference temperature.

Now returning to FIG. 1, an output value of the frequency difference detector 3 is practically (OSC2−OSC1), and this value can be a temperature detection value of around the crystal units 10 and 20 as shown in FIG. 9. Then, a second addition unit (a deviation amount extraction circuit) 6 is disposed in a position after the frequency difference detector 3. A difference between a temperature setting value, which is a digital signal (a 34-bit digital value of OSC2−OSC1 at setting temperature), and OSC2−OSC1, which is an output from the frequency difference detector 3, is retrieved. It is preferred to select a temperature where the OSC1 value corresponding to the first crystal unit 10 for obtaining an output from the crystal controlled oscillator is less likely to vary due to temperature change as the temperature setting value. As the temperature, in the curve of the relationship between the OSC1 and the temperature shown in FIG. 8, for example, 50° C., which corresponds to a bottom part of the curve, is selected. In a viewpoint of a temperature where the OSC1 value is less likely to vary due to temperature change, 10 degrees may be a setting temperature. In this case, the setting temperature may be lower than the room temperature, a temperature control unit in combination with the heating unit and a cooling unit such as a Peltier device is disposed.

In a position after the second addition unit 6, the selector 7 is disposed. The selector 7 outputs a digital signal selected from three input ports. In the position after the selector 7, a second loop filter 61 corresponding to an integration circuit unit is disposed. If the difference between f1 and f2 input to the above-described frequency difference detector 3 is within the detection range, the selector 7 outputs the output signal from the second addition unit 6 to the loop filter 61 as it is. The selector 7 will be described later together with the out-of-detection range determination unit 5 and now the loop filter 61 or later will be described.

In a position after the loop filter 61, a digital/analog (D/A) converter 62 is disposed. In a position after the D/A converter 62, the heater circuit 50 corresponding to the heating unit is disposed. In this example, the loop filter 61 and the digital/analog (D/A) converter 62 are included in the circuit unit for heating control.

Figure 11:
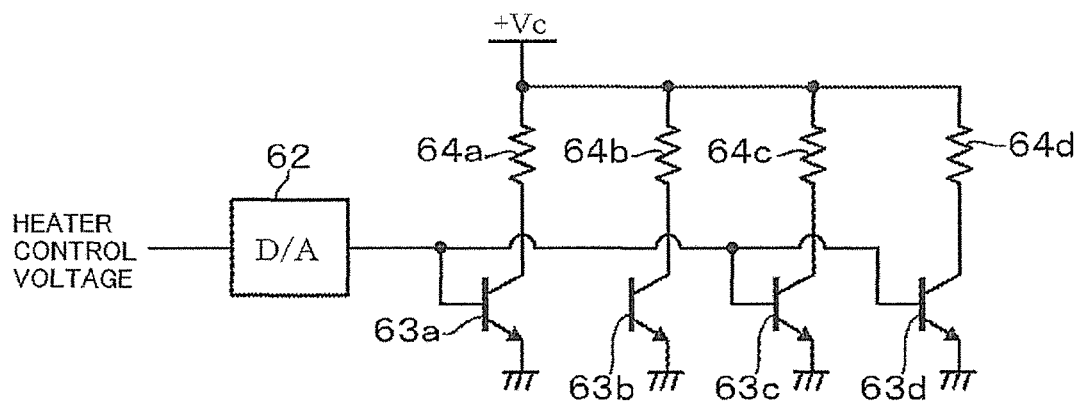
FIG. 11 is a circuit diagram illustrating a heater circuit constituting a heating unit.

As shown in FIG. 11, the heater circuit 50 includes series circuits that each include a transistor 63a (63b and 63c) and a resistor 64a (64b and 64c). The series circuits are connected in parallel to one another between a power source unit Vc and an earth. The output end of the D/A converter 62 is connected to the bases of the four transistors 63a to 63d. The relationship between: the voltage supplied to each base of the transistors 63a to 63d, and the total electric power of the power consumption of the transistors 63a to 63d and the power consumption of a resistor 64a to 64d, has a linear relationship. Accordingly, the heat generation temperature is linearly controlled corresponding to a difference between the above-described temperature data and a temperature setting value. In this example, the transistors 63a to 63d are also a part of a heat generator.

Figure 12:
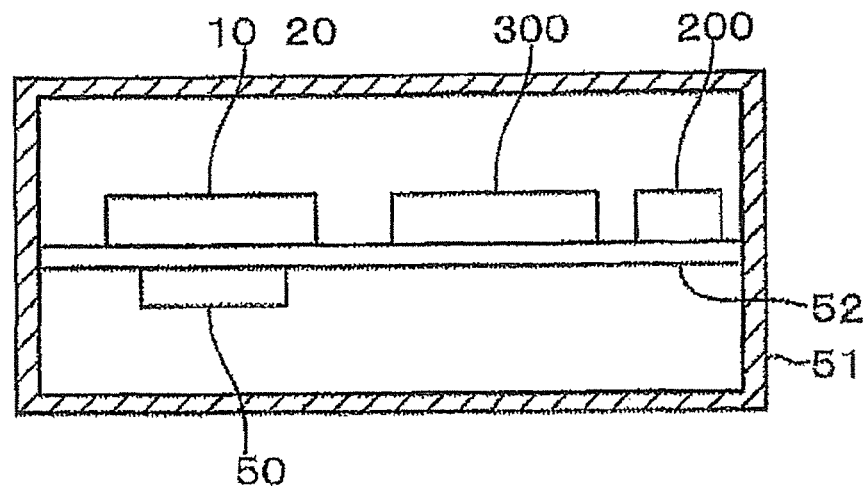
FIG. 12 is a schematic longitudinal cross-sectional side view illustrating a structure of the oscillating device according to the embodiment.

FIG. 12 illustrates a schematic structure of the oscillating device shown in FIG. 1. Reference numeral 51 denotes a container, and reference numeral 52 denotes a printed circuit board disposed in the container 51. The printed circuit board 52 includes, for example, the crystal units 10 and 20, an integrated circuit unit 300, and the control circuit unit 200 on its upper surface side. The integrated circuit unit 300 forms circuits that perform a digital process including, for example, the oscillator circuits 1 and 2 and the frequency difference detector 3 in one chip. The printed circuit board 52 includes the heater circuit 50 at a position, for example, facing the crystal units 10 and 20 on its lower surface side. Heat generation of the heater circuit 50 maintains the crystal units 10 and 20 at the setting temperature.

Explanation of Main Part of Embodiment (Problem of Frequency Difference Detector)

Figure 13A:
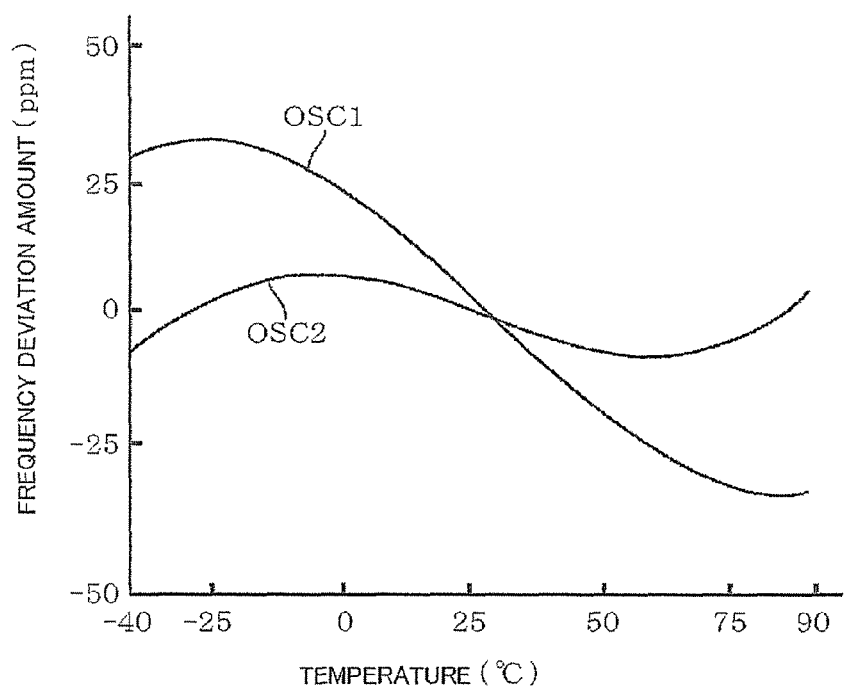
FIG. 13A and FIG. 13B are characteristic views illustrating respective examples of frequency versus temperature characteristics of a first crystal unit and a second crystal unit.
Figure 13B:
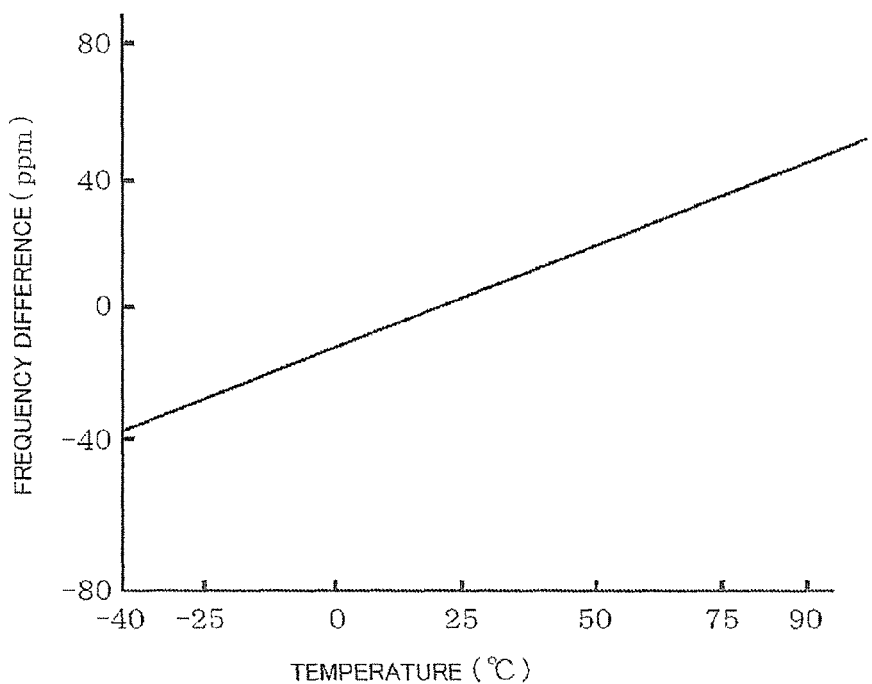
Figure 14A:
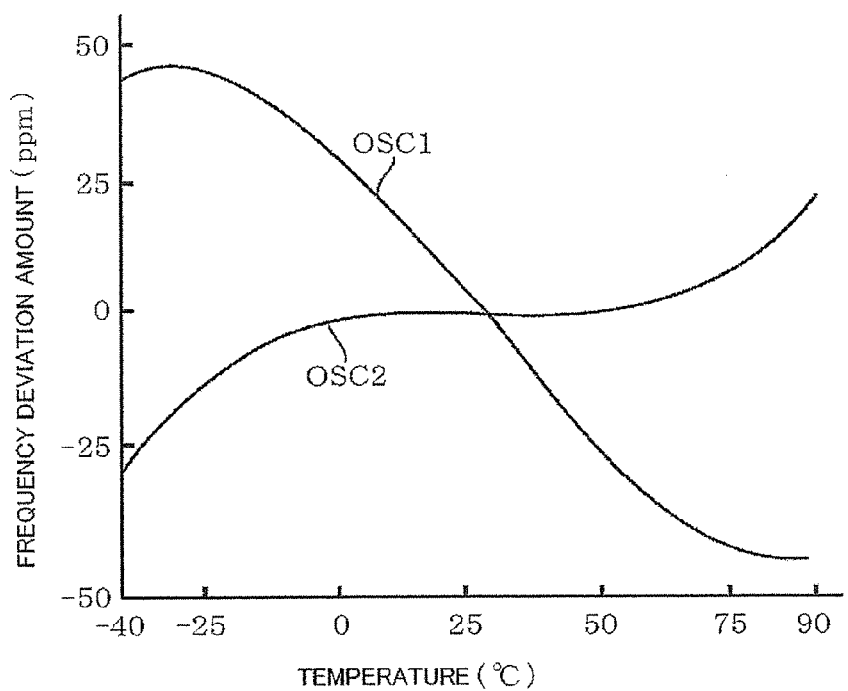
FIG. 14A and FIG. 14B are characteristic views illustrating an example of each frequency versus temperature characteristic of the first crystal unit and the second crystal unit.
Figure 14B:
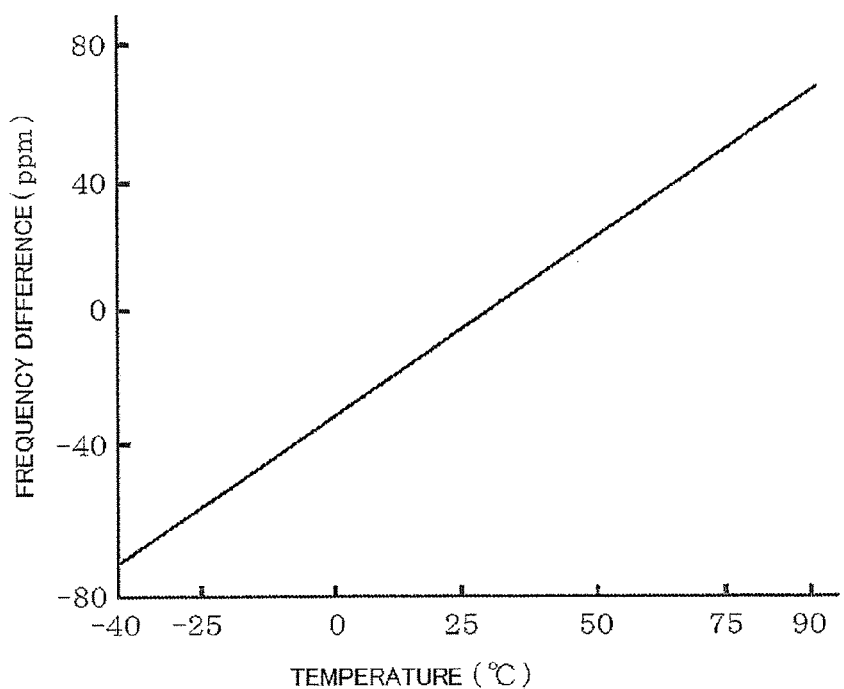

FIG. 13A illustrates a rate of change of frequency of a value at a certain temperature with respect to the value at the reference temperature, for example, 25° C., in frequencies of the two crystal units. FIG. 13B illustrates a relationship between the difference in rates of change of frequency of the two curves and the temperature. FIG. 14A and FIG. 14B illustrate a similar relationship about another two crystal units. As seen from the graphs, respective frequency-temperature characteristics of the two crystal units, so-called temperature detectors, vary depending on the set of the two crystal units.

Now, taking the curve illustrating the relationship between the operation value from the expression and the temperature, the curve is the same as the curve illustrating the relationship of the rate of change of frequency, $[\{(f2-f2r)/f2r\}-\{(f1-f1r)/f1r\}]$ and the temperature. Accordingly, a value obtained at the PLL disposed in a position after the one-shot circuit 32 is the vertical axis value in FIG. 14B. To normally operate the PLL, the output frequency (f2−f1) of the one-shot circuit 32, which is an input value of PLL, needs to be in a range of a frequency that can be received in the PLL.

Figure 15:
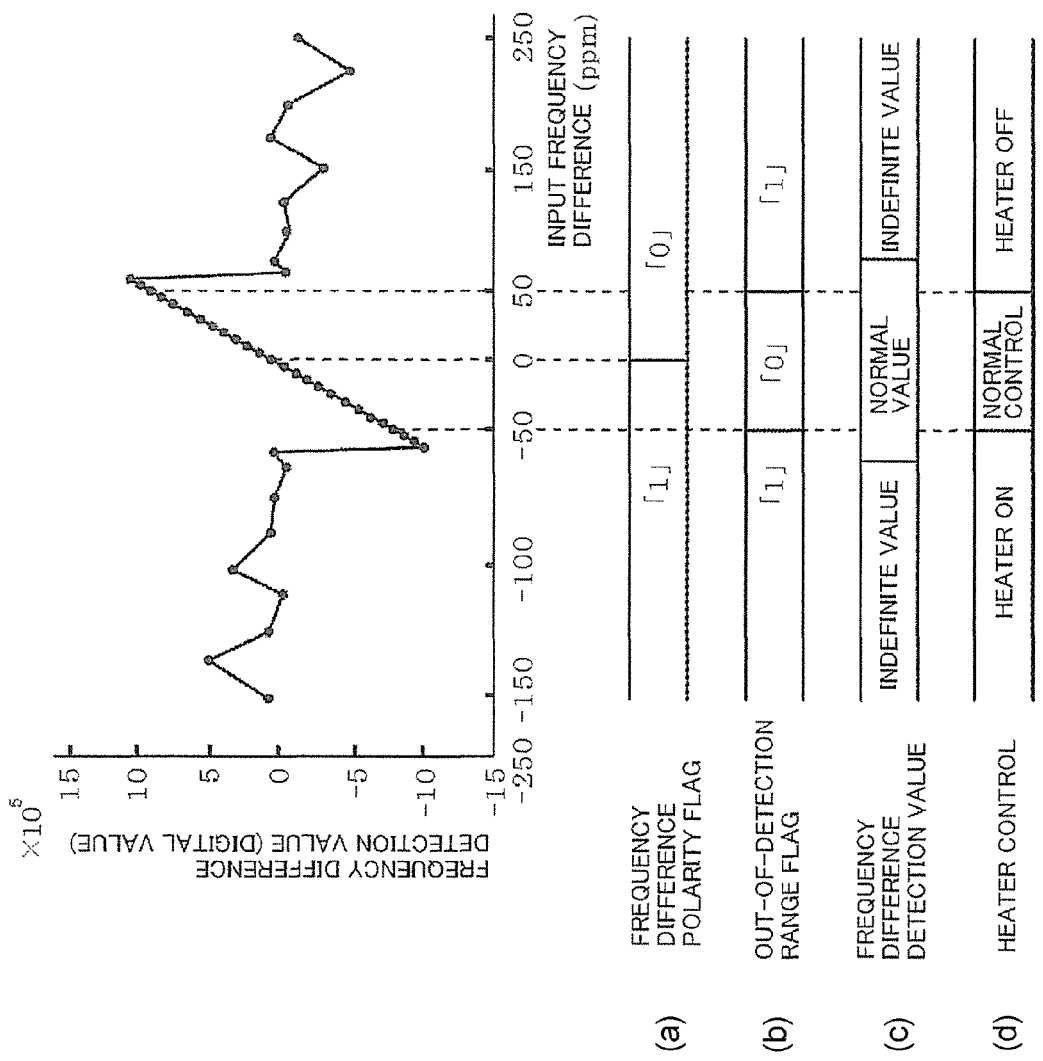
FIG. 15 is a graph chart illustrating a correspondence relationship between a value corresponding to a signal input to PLL of a frequency difference detector and a digital value taken out from the PLL; and explanatory drawings illustrating a relationship between the graph and heater control.

FIG. 15 illustrates a graph at its upper portion. In this graph, values where the output frequency (input value of PLL) from the one-shot circuit 32 are varied are plotted to the horizontal axis, and values actually obtained from the first loop filter 34 are plotted to the vertical axis. As seen from FIG. 15, the output frequency from the one-shot circuit 32 forms a linear relationship in the range where the output frequency can be received in the PLL. However, when the output frequency of the one-shot circuit 32 is out of the range where the output frequency can be received in the PLL, the value of the first loop filter 34 becomes an indefinite value (Although rough trend of the input value to the PLL can be seen, the value is not always the same).

Thus, if the value of the loop filter 34, namely, the temperature detection value, become an indefinite value, the heater cannot be normally controlled. The following malfunctions, for example, occur. Although the heater circuit 50 must be turned OFF due to too high temperature around the crystal unit, the heater circuit 50 remains ON. Alternatively, although the power of the heater circuit 50 must be increased due to low temperature around the crystal unit, the heater circuit 50 is turned OFF or an appropriate power is not supplied to the heater circuit 50. Thus, the first crystal unit and the second crystal unit with appropriate frequency-temperature characteristics need to be selected, thus bringing reduction in a yield of the crystal unit.

Device Items Related to Frequency Difference Detector

This embodiment includes the out-of-detection range determination unit 5, which serves as a determination unit (see FIG. 1). The out-of-detection range determination unit 5 determines whether the output frequency from the one-shot circuit 32 to be received in the PLL of the frequency difference detector 3 is within the range that the PLL can receive (detection range) or not. The out-of-detection range determination unit 5 further includes a function to determine whether the output frequency is larger than the detection range or smaller than the detection range in the case where the output frequency is not within the detection range in addition to the determination function.

Now, assume that the range, for example, from "−50" to "50" in the horizontal axis in FIG. 15 is set within the detection range. Assume that values where these values are converted into the output frequency values of the one-shot circuit 32 are defined as "$f_{-50}$" and "$f_{50}$", respectively for convenience of explanation. Even if the output frequency is slightly out of the "−50" to "50" range, the PLL can actually receive the frequency; however, the detection range is set considering a margin.

In this case, the out-of-detection range determination unit 5 has a function to detect the value of the output frequency (frequency of output pulse) from the one-shot circuit 32 and determines whether the output frequency is between "$f_{-50}$" and "$f_{50}$" (detection range) or not. Further, the out-of-detection range determination unit 5 has a function to determine whether the output frequency is out of on the "$f_{-50}$" side (out of on the low temperature side) or out of on the "$f_{50}$" side (out of on the high temperature side) in the case where the output frequency is out of the detection range. The reason for determining whether the output frequency is positioned on the high temperature side or the low temperature side with respect to the detection range is that contents of the heater control changes according to the position.

Figure 16:
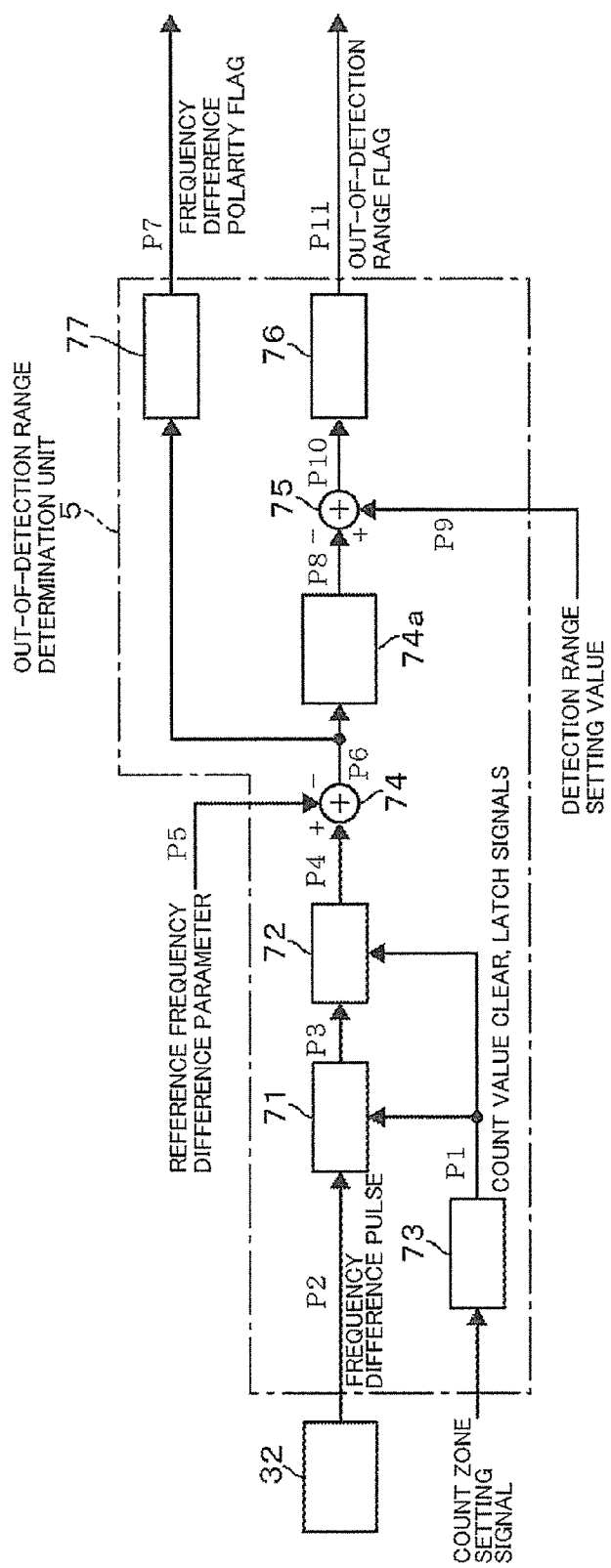
FIG. 16 is a circuit diagram illustrating a detail of an out-of-detection range determination unit.

FIG. 16 illustrates one exemplary circuit configuration of the out-of-detection range determination unit 5 that achieves the function. The output pulse of the one-shot circuit 32 is counted for the certain period by a counter 71. The count value is latched by a latch circuit 72. A timer 73 outputs signals, which clear the count value in the counter 71 at an interval of a certain period and latch the count value up to the period, to the latch circuit 72. An external computer receives a signal for setting a count zone to the memory 30, for example. Then, according to the setting signal, a time point that the signal is output from the timer 73 (the interval of certain period) is adjusted. In this example, the counter 71, the latch circuit 72, and the timer 73 configure a frequency measuring unit. The frequency measuring unit measures frequencies in the set period in an output pulse train of the one-shot circuit 32.

For simplification of description, the following describes a time interval of a timing signal from the timer 73 is treated as 1 second for convenience.

A third addition unit 74 compares the count value output from the latch circuit 72 with a reference frequency difference parameter and then takes out the difference. Then, an absolute value converter 74a obtains an absolute value for the difference value (addition value when considering a polarity of the input value). This calculation corresponds to obtaining a difference between the output frequency from the one-shot circuit 32 corresponding to the zero point in the horizontal axis direction and the detected output frequency in the graph at the upper portion of FIG. 15. The positive/negative signs of the output value from the third addition unit 74 shows which is larger of the frequency latched by the latch circuit 72, and the reference frequency parameter. It can be said that the third addition unit 74 is a circuit for comparison of both signals.

Accordingly, the reference frequency difference parameter is a temperature where $[\{(f2-f2r)/f2r\}-\{(f1-f1r)/f1r\}]$ value becomes zero (temperature where the vertical axis value in FIG. 7 and FIG. 8 becomes zero), namely, an output value from the latch circuit 72 at the reference temperature (25° C., for example). Specifically, the reference frequency difference parameter is a value corresponding to the medium value between the above-described "$f_{-50}$" and "$f_{50}$" (value found by adding both and then dividing the value by 2).

Further, a fourth addition unit 75 compares the absolute value with a detection range setting value. That is, the fourth addition unit 75 subtracts the absolute value from the detection range setting value. When corresponded to the graph at the upper portion of FIG. 15, the detection range setting value is a value corresponding to an absolute value (distance) of a difference between a value corresponding to the upper limit value (or the lower limit value) of the detection range and the medium value between "−50" and "50." The detection range setting value is specifically an absolute value of a difference between "$f_{-50}$" (or "$f_{50}$") and the medium value between "$f_{-50}$" and "$f_{50}$."

Accordingly, if the sign of the addition value in the fourth addition unit 75 is positive, the output frequency from the one-shot circuit 32 is positioned between "$f_{-50}$" and "$f_{50}$," which is within the detection range. In contrast, if the polarity of the addition value in the fourth addition unit 75 is negative, the output frequency from the one-shot circuit 32 is a value out of between $f_{-50}$" and "$f_{50}$", which is out of the detection range. A first polarity determination unit 76 determines a polarity of the addition value in the fourth addition unit 75 and outputs a logic "1" value as an out-of-detection range flag if the polarity of the addition value is negative.

Meanwhile, a second polarity determination unit 77 determines the polarity of the addition value obtained by the third addition unit 74. When the polarity is positive, this means that the output frequency from the one-shot circuit 32 is greater than the value of the reference frequency difference parameter. Accordingly, the output frequency is positioned at the high temperature side with respect to the detection range, and the logic "0" value is output from the second polarity determination unit 77. In contrast, when the polarity is negative, this means that the output frequency is smaller than the value of the reference frequency difference parameter. Accordingly, the output frequency is positioned at the low temperature side with respect to the detection range, and the logic "1" value is output from the second polarity determination unit 77.

Now returning to FIG. 1, the selector 7, which is a signal selector, is disposed at a signal path in a position after the second addition unit 6 side. The selector 7 is configured in combination with the logic circuit. The selector 7 selects one input value among three input values: the output value from the second addition unit 6, the maximum value of the heater control signal, and the minimum value of the heater control signal, based on a determination signal from the out-of-detection range determination unit 5. The purpose of the signal is as follows. In the case where the output frequency from the one-shot circuit 32 is within the detection range, an output value from the second addition unit 6 is output as it is. On the other hand, in the case where the output frequency is out of the detection range, electric power (power) supplied to the heater circuit 50 is minimized or maximized corresponding to positive/negative of the temperature characteristics of the heater circuit 50. The heater circuit 50 shown in FIG. 11 has a negative temperature characteristic. However, for convenience of explanation, the following is described assuming that the heater circuit 50 has a positive characteristic. In the case where the heater circuit 50 has a positive characteristic, the selector 7 has a role of minimizing the power for the heater circuit 50 when the output frequency is out of the detection range on the high temperature side. Alternatively, if the output frequency is out of the detection range at the low temperature side, the selector 7 has a role of maximizing the power for the heater circuit 50.

To serve such roles, when the out-of-detection range flag output from the out-of-detection range determination unit 5 is logic "0", the selector 7 outputs the signal from the second addition unit 6. On the other hand, in the case where the out-of-detection range flag output from the out-of-detection range determination unit 5 is logic "1", the selector 7 selects the maximum value with logic "1" of the frequency difference polarity flag and selects the minimum value with logic "0" of the frequency difference polarity flag. In FIG. 15, (a) to (d) at the lower portion of FIG. 15 illustrate correspondence of the output from with the out-of-detection range determination unit 5 with a control state of the heater circuit 50.

FIG. 1 indicates the minimum value of the power on the input side of the selector 7. Note that the minimum value corresponds to a signal that, for example, turns the heater power to zero, that is, the heater circuit 50 is in a "off" state where electric power is not supplied.

Figure 17:
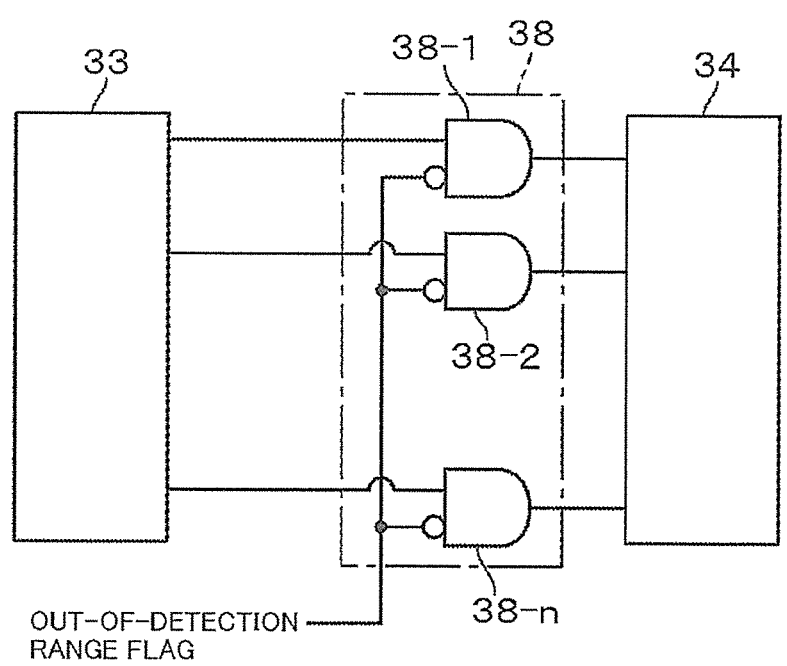
FIG. 17 is a circuit diagram illustrating a logic circuit inserted in the PLL.

In this example, as described above, the logic circuit 38 is disposed between the latch circuit 33 and the first loop filter 34. FIG. 2 omits illustration of signal line as one signal line. However, if a digital signal is n bit (for example, 34 bits), as shown in FIG. 17, n pieces of logic elements 38-1 to 38-n are disposed corresponding to the n pieces of signal lines. Each logic element 38-1 to 38-n is configured as AND circuit where an inversion signal of the input signal is input to one input port. A line that outputs the out-of-detection range flag (determination signal) of the out-of-detection range determination unit 5 is connected to one input port, and an output line from the latch circuit 33 is connected to the other input port of each logic element 38-1 to 38-n.

Accordingly, if the out-of-detection range flag is logic "0" (if the output frequency from the one-shot circuit 32 is within the detection range), the signal from the latch circuit 33 is output as it is. However, if the out-of-detection range flag is logic "1", the 34-bit signal becomes zero, stopping the PLL. The reason why it is thus configured is to avoid a situation that the PLL does not receive in a normal value even if the output frequency from the one-shot circuit 32 returns to within the detection range because the PLL is locked at an inappropriate value.

Description of Component Parts Regarding TCXO Function

The oscillating device according to this embodiment includes a TCXO function as described above. The function performs temperature compensation on a reference clock input to the control circuit unit 200. Specifically, the frequency deviation information by the amount of variation in temperature obtained in the loop filter 34 of the PLL is input to a correction value operator 4, which is the correction value obtaining unit shown in FIG. 1. The correction value for the frequency is operated here. The frequency deviation information by the amount of variation in temperature is a value corresponding to a difference between an oscillation frequency of a first oscillator circuit 1 when the crystal unit 10 is under the reference temperature and an oscillation frequency of the first oscillator circuit 1 when the crystal unit 10 is under atmosphere temperature (temperature in the container in which the crystal unit 10 is housed).

In this example, since the oscillating device has the OCXO function, a value corresponding to the difference is usually a constant value. However, in the case where the environmental temperature where the oscillating device is installed is varied beyond the prediction, the TCXO function is exercised.

As described above, the oscillating device of the embodiment uses a frequency signal (f1) obtained from the first oscillator circuit 1 as a reference clock for the control circuit unit 200 shown in FIG. 1. Since the reference clock has frequency versus temperature characteristics, temperature correction is performed on the frequency of the reference clock. Accordingly, first, a function indicating the relationship between the temperature normalized at the reference temperature and f1 is preliminarily obtained. Then, a function to offset the amount of frequency variation of f1 by the function is obtained. The correction value operator 4 obtains a correction signal to offset the amount of frequency variation based on the temperature detection signal obtained at the frequency difference detector 3 and the function. A description will be further added in this respect.

As shown in FIG. 1, the first crystal unit 10 and the second crystal unit 20 are configured using the common crystal element Xb and thermally coupled with one another. Accordingly, the frequency difference between the oscillator circuits 1 and 2 is a value corresponding to the environmental temperature at significant accuracy. Accordingly, the output from the frequency difference detector 3 is temperature difference information between the environmental temperature and the reference temperature (25° C. in this example). The frequency signal f1 output from the first oscillator circuit 1 is used as a main clock for the control circuit unit 200. Accordingly, the correction value obtained at the correction value operator 4 is employed as a signal to compensate the operation by the control circuit unit 200 to offset an influence to the operation by the control circuit unit 200 due to the amount of frequency deviation of f1 due to deviation of the temperature from the 25° C. Consequently, the output frequency from the voltage controlled oscillator 100, which is an output from the first oscillator circuit 1 in this embodiment, becomes stable regardless of temperature variation.

Entire Operation of Embodiment

Next, the entire operation of the above-described embodiment will be summarized. Focusing on the crystal controlled oscillator of the oscillating device, the output from the crystal controlled oscillator corresponds to the frequency signal output from the first oscillator circuit 1. The heater circuit 50 is heated so that atmosphere where the crystal units 10 and 20 are placed becomes the setting temperature. The first crystal unit 10 and the first oscillator circuit 1 generate a frequency signal, which is an output from the crystal controlled oscillator. However, the first crystal unit 10 and the first oscillator circuit 1 serve as a temperature detector together with the second crystal unit 20 and the second oscillator circuit 2. The value OSC2−OSC1, which is a value corresponding to the frequency difference of frequency signals obtained from each oscillator circuit 1 and 2 corresponds to a temperature as described above. The second addition unit 6 takes out the difference between the temperature and the temperature setting value (OSC2−OSC1 value at, for example, 50° C.).

In the case where the output frequency from the one-shot circuit 32 is within the detection range, the loop filter 61 integrates this difference and then the D/A converter 62 converts the integrated value into an analog DC voltage, thus the control electric power for the heater circuit 50 is adjusted. Assume that the output value from the frequency difference detector 3 at 50° C. is $-1.5 \times 10^5$. As seen from the characteristic view shown in FIG. 10, the output from the second addition unit 6 is a positive value with the temperature lower than 50° C. and increases with decreasing temperature. Accordingly, the control electric power for the heater circuit 50 acts large as the atmosphere temperature where the crystal units 10 and 20 are placed becomes lower than 50° C. When the atmosphere temperature is higher than 50° C., the output becomes a negative value and the absolute value increases as the temperature rises.

Accordingly, as the temperature becomes higher than 50° C., electric power supplied to the heater acts to decrease. Therefore, the atmosphere temperature where the crystal units 10 and 20 are placed is attempted to be maintained at 50° C., which is a setting temperature. This stabilizes the output frequency from the first oscillator circuit 1, which is an oscillation output. Consequently, the frequency of the reference signal supplied to a phase comparator 205 is stabilized in the control circuit unit 200 where the output from the first oscillator circuit 1 is employed as the clock signal. This also stabilizes the output frequency from the voltage controlled oscillator 100, which is an output from the oscillating device (frequency synthesizer).

The items related to the correction value operator 4 have already described and therefore is omitted.

Figure 18:
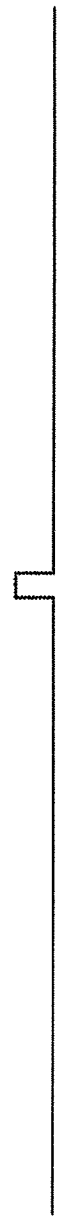
FIG. 18 is a timing chart illustrating respective signals or values of the out-of-detection range determination unit shown in FIG. 16.

Next, the relationship between the output frequency from the one-shot circuit 32 shown in FIG. 2 and the control of the heater circuit 50 will be described with reference to FIG. 18. FIG. 18 is a timing chart illustrating each signal or value of the out-of-detection range determination unit 5 shown in FIG. 16. It can be said that the output frequency from the one-shot circuit 32 corresponds to a frequency difference between the oscillation frequency f1 of the first oscillator circuit 1 and the oscillation frequency f2 of the second oscillator circuit 2. Both too large a frequency difference and too small a frequency difference fall out of the PLL reception range, such that the output frequency needs to be kept within a certain range.

The timer 73 shown in FIG. 16 counts an operation clock at free run (endless) with count zone setting parameter and outputs a clear signal and a latch signal at each count up. Assume that currently the out-of-detection range flag is logic "0", that is, the output frequency from the one-shot circuit 32 is within the detection range. At this time, the selector 7 shown in FIG. 1 outputs a value from the second addition unit 6 to the second loop filter 61, and then what is called normal control is performed on the heater circuit 50.

Assume that the count value of the output frequency is latched by the latch circuit 72 at the timer output, the value is "3456," and the reference frequency parameter is set to "3500." The third addition unit 74 outputs "−44." Since the absolute value of the value is "44" and the detection range setting value is "40", the output value from the fourth addition unit 75 is "−4." The negative polarity of the value means that the frequency difference is out of the detection range, that is, the output frequency from the one-shot circuit 32 is out of the detection range. The out-of-detection range flag (determination signal) is changed from logic "0" to logic "1." Accordingly, the 34-bit output from the logic circuit 38 shown in FIG. 2 becomes zero, stopping the PLL.

Since the polarity of the output value from the third addition unit 74 is negative, as described above, the frequency difference polarity flag becomes logic "1." That is, the frequency difference is too small and smaller than the detection range (take-in range of the PLL). This state is a state where the frequency difference is out of the low temperature side with respect to the detection range. Therefore, the selector 7 outputs a signal corresponding to the maximum value and the maximum electric power is supplied to the heater circuit 50. The values in FIG. 18 are values for convenience of explanation.

In the case where the count value of the output frequency is "3544" by the latch circuit 72, the out-of-detection range flag becomes logic "1" and the frequency difference polarity flag becomes logic "0." Accordingly, electric power supplied to the heater circuit 50 becomes zero.

Effects of Embodiment

As described above, with the above-described embodiment, a difference of a value corresponding to the frequency difference between the frequency signals obtained from the respective crystal unit 10 and 20 is employed as a temperature detection value, and the heater circuit 50 that manages the atmosphere temperature of the crystal units 10 and 20 is controlled based on the temperature detection value. This allows maintaining the atmosphere temperature at the setting temperature with high accuracy, stabilizing the output from the crystal controlled oscillator (output from the first oscillator circuit 1).

In the above-described embodiment, a pulse corresponding to the difference frequency between f1 and f2 is generated to obtain frequency difference detection information, the latch circuit 33 latches a sawtooth wave signal output from the DDS circuit unit 36 with the pulse, the latched signal value is integrated, and the integrated value is output as the frequency difference. The difference between the output and a value corresponding to the difference between f1r and f2r is taken out, and the value is input to the DDS circuit unit 36, thus the PLL is configured. Accordingly, the frequency difference detection information can be obtained with high accuracy.

The circuit determines whether a frequency in the set period at a pulse train output from the one-shot circuit 32 can be received in the PLL or not. If the frequency in the set period in the pulse train is out of the detection range at the high temperature side, electric power supplied to the heating unit is set to, for example, zero. If the frequency is out of the detection range at the low temperature side, the electric power is set to, for example, the maximum value.

Therefore, a problem that the heater cannot be normally controlled with an indefinite temperature detection value can be solved, obtaining an oscillation output with high frequency stability. This leads to reduction in requests of frequency-temperature characteristics for each first crystal unit 10 and second crystal unit 20. Consequently, reduction in a yield of the crystal unit can be reduced.

Other Explanation

In the case where the frequency in the set period at the pulse train output from the one-shot circuit 32 is out of the detection range at the high temperature side (right side in FIG. 15), electric power supplied to the heater circuit 50 is set to zero. However, the electric power is not limited to zero insofar as the frequency in the set period is smaller value than the supplied electric power in the detection range. In the case where the frequency in the set period at the pulse train output from the one-shot circuit 32 is out of the detection range at the low temperature side (left side in FIG. 15), the electric power is not limited to the maximum value. The electric power may be near the maximum value. Alternatively, the electric power is not limited to the values but may be a preset value.

The frequency difference detector 3 may use a difference value between (f1−f1r) and (f2-f2r) itself as a value corresponding to the difference value between a value corresponding to the difference between f1 and f1r and a value corresponding to the difference between f2 and f2r. In this case, the temperature is obtained utilizing the graph in FIG. 7.

Further, in the above-described example, the first crystal unit 10 and the second crystal unit 20 use the common crystal element Xb. However, the crystal element Xb may not be used in common. In this case, there is an example where the first crystal unit 10 and the second crystal unit 20 are disposed in a common casing, for example. This configuration places the first crystal unit 10 and the second crystal unit 20 under the actually same temperature atmosphere; therefore, similar effects can be obtained.

The output signal from the DDS circuit unit 36 of the frequency difference detector 3 is not limited to a sawtooth wave. It is only necessary that the output signal be a frequency signal that repeats an increase and a decrease of a signal value with time, the output signal may be, for example, a sine wave.

The frequency difference detector 3 may count f1 and f2 by a counter, a value corresponding to Δfr may be subtracted from the difference value of the count value, and a value corresponding to the obtained count value may be output.

In the above-described embodiment, the first crystal unit 10 and the first oscillator circuit 1 have a role that takes out the temperature detection value and a role that creates an output from the crystal controlled oscillator. That is, the oscillator circuit 1 shares an oscillator circuit for temperature detection and an oscillator circuit for output from the crystal controlled oscillator. However, the present disclosure may also be configured as follows. Three crystal units and three oscillator circuits may be prepared, for example. In the configuration in FIG. 1, for example, a third crystal unit and a third oscillator circuit connected to the crystal unit may be prepared. An output from the third oscillator circuit may be as an output from the crystal controlled oscillator. Oscillation outputs from the remaining first oscillator circuit and the second oscillator circuit may be input to the frequency difference detector to obtain the temperature detection value. In this case, if the OCXO is combined with the TCXO, the output from the third crystal oscillator circuit is used as a clock for the DDS circuit unit 201.

The frequency synthesizer, which is an oscillating device shown in FIG. 1 and FIG. 16, is configured using the crystal controlled oscillator of the embodiment of the present disclosure constituted of the crystal units 10 and 20, the oscillator circuits 1 and 2, the frequency difference detector 3, and the part from the second addition unit 6 to the heater circuit 50. However, the present disclosure is not limited to be configured as a frequency synthesizer. A configuration where the oscillation output from the first oscillator circuit 1 may be treated as an output from the crystal controlled oscillator of the present disclosure, that is, the control circuit unit 200 is not used may be also applicable.

What is claimed is:

1. A crystal controlled oscillator, comprising:
   an oscillator circuit for oscillator output, being connected to a crystal unit for oscillator output;
   a first oscillator circuit and a second oscillator circuit, being connected to respective first crystal unit and second crystal unit for temperature detection;
   a heating unit, being configured to uniform an atmosphere temperature where each of the crystal units is placed;
   a pulse generator and a frequency difference detector, assume that an oscillation frequency of the first oscillator circuit is f1, an oscillation frequency of the first oscillator circuit at a reference temperature is f1r, an oscillation frequency of the second oscillator circuit is f2, and an oscillation frequency of the second oscillator circuit at the reference temperature is f2r, the pulse generator being configured to output a pulse at a time point where one of the f1 and the f2 latches another f1 or f2, the frequency difference detector being configured to obtain a direct current voltage corresponding to a difference value between a value corresponding to a difference between f1 and f1r and a value corresponding to a difference between f2 and f2r with phase locked loop based on a train of the pulses, as a temperature detection value;
   an addition unit, being configured to take out a deviation between a temperature setting value of atmosphere temperature where the first and the second crystal units are placed and the temperature detection value;
   a circuit unit, being configured to control heating electric power that controls electric power supplied to the heating unit based on the deviation taken out at the addition unit;
   a frequency measuring unit, being configured to measure a frequency in a set period at the train of pulses;
   a determination unit, being configured to determine whether the frequency measured by the frequency measuring unit is included in a detection range, out of the detection range at a high temperature side, or out of the detection range at a low temperature side; and
   a signal selector configured to: select a control signal where electric power supplied to the heating unit is smaller than supplied electric power in the detection range in a case where a frequency in a set period at the train of pulses is out of the detection range at the high temperature side; select a control signal where electric power supplied to the heating unit becomes a preset value in a case where a frequency in the set period at the train of pulses is out of the detection range at the low temperature side.

2. The crystal controlled oscillator according to claim 1, wherein
   the frequency difference detector includes:
     a pulse generator, being configured to output a pulse at a time point where one of the f1 and the f2 latches another f1 or f2;
     a direct digital synthesizer circuit unit, being configured to output a frequency signal that repeats an increase and a decrease of a signal value with a time at a frequency corresponding to a magnitude of input DC voltage;
     a latch circuit, being configured to latch a frequency signal output from the direct digital synthesizer circuit unit with a pulse generated at the pulse generator;
     a loop filter, being configured to integrate a signal value latched by the latch circuit and output the integrated value as a value corresponding to the difference value; and
     an addition unit, being configured to take out a difference between an output from the loop filter and a value corresponding to a difference between f1r and f2r and input to the direct digital synthesizer circuit unit.

3. The crystal controlled oscillator according to claim 1, wherein
   the control signal where electric power supplied to the heating unit is smaller than electric power supplied in the detection range is a control signal that zeros electric power supplied to the heating unit.

4. The crystal controlled oscillator according to claim 1, wherein
   the control signal that sets electric power supplied to the heating unit to a preset value makes electric power supplied to the heating unit to be a maximum value or near the maximum value.

5. The crystal controlled oscillator according to claim 1, wherein
   the oscillator circuit for oscillator output is used in common with one of the first oscillator circuit and the second oscillator circuit.

6. The crystal controlled oscillator according to claim 1, wherein
   the frequency measuring unit includes:
     a counter, being configured to count a pulse in the train of pulses;
     a latch circuit, being configured to latch a count value in the counter;
     a timer, being configured to output a signal to clear a count value in the counter at an interval of a certain period; and latch the count value until being cleared by the latch circuit.

7. The crystal controlled oscillator according to claim 1, wherein
   the determination unit includes: a circuit being configured to compare a frequency measured at the frequency measuring unit with a frequency of a pulse in the train of pulses at the reference temperature; and make the determination based on a comparison result.

8. The crystal controlled oscillator according to claim 1, wherein
   the determination unit includes:
     a circuit for determination, being configured to determine that which is larger of a frequency measured by the frequency measuring unit and a frequency of a pulse in the train of pulses at the reference temperature; and
     a circuit for comparison, being configured to compare a difference of these frequencies with a setting value for determining whether the frequency is within a detection range or out of the detection range.

9. The crystal controlled oscillator according to claim 1, further comprising:
   a circuit configured to stop phase locked loop of the frequency difference detector, in a case where the determination unit determines that a frequency measured by the frequency measuring unit is out of the detection range at the high temperature side or out of the detection range at the low temperature side based on a determination signal corresponding to an out-of-detection range flag output from the determination unit.

10. An oscillating device, comprising:

the crystal controlled oscillator according to claim 1; and a main circuit unit of the oscillating device including phase locked loop, the main circuit unit being configured to treat an oscillation output from the crystal controlled oscillator as a clock signal.

\* \* \* \* \*